United States Patent
Lafferty et al.

(10) Patent No.: US 9,335,626 B2
(45) Date of Patent: May 10, 2016

(54) MASK DESIGN AND DECOMPOSITION FOR SIDEWALL IMAGE TRANSFER

(71) Applicant: GLOBALFOUNDRIES INC., Grand Cayman, KY (US)

(72) Inventors: Neal V. Lafferty, Albany, NY (US); Lars W. Liebmann, Poughquag, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/960,873

(22) Filed: Aug. 7, 2013

(65) Prior Publication Data

US 2015/0046888 A1  Feb. 12, 2015

(51) Int. Cl.
*G06F 17/50* (2006.01)
*G03F 1/70* (2012.01)

(52) U.S. Cl.
CPC .......................................... *G03F 1/70* (2013.01)

(58) Field of Classification Search
CPC .......................... G06F 17/5068; G06F 2217/12
USPC ........................................................... 716/55
See application file for complete search history.

(56) References Cited

U.S. PATENT DOCUMENTS

| | | | |
|---|---|---|---|
| 8,560,998 B1 * | 10/2013 | Salowe et al. | 716/126 |
| 8,707,223 B2 * | 4/2014 | Blatchford | 716/55 |
| 8,775,983 B1 * | 7/2014 | Wang | 716/54 |
| 2011/0014786 A1 * | 1/2011 | Sezginer et al. | 438/618 |

OTHER PUBLICATIONS

Badr, Y.A. et al., "Split-It!: From Litho Etch Litho Etch to Self-Aligned Double Patterning Decomposition" Proc. of SPIE (Dec. 6, 2012) pp. 852225-1-852225-8, vol. 8522.

Ma, Y. et al., "Self-Aligned Double Patterning (SADP) Compliant Design Flow" Proc. of SPIE (Mar. 29, 2012) pp. 832706-1-832706-13, vol. 8327.

* cited by examiner

*Primary Examiner* — Jack Chiang
*Assistant Examiner* — Brandon Bowers
(74) *Attorney, Agent, or Firm* — Scully, Scott, Murphy & Presser, P.C.

(57) ABSTRACT

A design level compatible with a sidewall image transfer process employs an alternating grid of mandrel-type line tracks and non-mandrel-type line tracks. Target structure design shapes are formed such that all vertices of the target structure design shapes are on the grid. The target structure design shapes are classified as mandrel-type design shapes and non-mandrel-type design shapes depending on the track type of the overlapping line tracks for lengthwise portions. All mandrel-type line tracks and straps of the mandrel-type design shapes less lateral strap regions of the non-mandrel-type design shapes collectively form mandrel design shapes, which can be employed to generate a first lithographic mask. Sidewall design shapes are generated from the mandrel design shapes. Blocking shapes for a second lithographic mask can be generated by selecting all areas that are not included in the target structure design shapes or the sidewall design shapes.

20 Claims, 9 Drawing Sheets

FIG. 1
(Prior Art)

| SIDEWALL IMAGE TRANSFER (SIT) PROCESS | |
|---|---|
| DESIGN LAYOUT | |
| DECOMPOSED LAYOUT | |
| LITHOGRAPHIC MASK 1 | |
| STRUCTURE AFTER FIRST LITHOGRAPHIC EXPOSURE | |
| STRUCTURE AFTER SPACER DEPOSITION | |
| STRUCTURE AFTER REMOVAL OF MANDREL STRUCTURES | |
| LITHOGRAPHIC MASK 2 | |
| STRUCTURE AFTER SECOND LITHOGRAPHIC EXPOSURE | |
| STRUCTURE AFTER A PATTERN TRANSFER ETCH | |

FIG. 2

MASK DESIGN AND DECOMPOSITION FOR SIDEWALL IMAGE TRANSFER

BACKGROUND

The present disclosure relates generally to a design methodology for a design layout, and particularly to a method of designing shapes for a design level employing sidewall image transfer within a design layout, and a method of generating a set of lithographic masks from the design layout for a sidewall image transfer process, and an apparatus for implementing the methods.

The sidewall image transfer process is a process employed to overcome the limitations of conventional lithography and to enable printing of sublithographic features employing conventional lithography tools. FIG. 1 illustrates the steps employed in a prior art sidewall image transfer process. A design layout including a design level is generated. The design layout includes a periodic one-dimensional array of design shapes, which are classified into two types. A first lithographic mask including every other design shapes and a dummy design shape is generated. Mandrel structures are formed on a physical structure (which can be a substrate) employing the first lithographic mask. Spacers are formed around the mandrel structures by deposition of a conformal material layer and an anisotropic etch. The mandrel structures are subsequently removed. A second lithographic mask is generated to block portions of the spacers overlying regions in which design shapes are not present in the design layout. A photoresist is applied over the physical structure, and cover regions corresponding to the block shapes in the second lithographic mask. A composite pattern derived from the shapes of the spacers and the second lithographic mask can be transferred into the physical structure.

While the sidewall image transfer process is conceptually simple, generation of the shapes to be included in the first lithographic mask and the second lithographic mask becomes exponentially difficult when the periodic one-dimensional array of design shapes is replaced with a non-periodic pattern including arbitrary design shapes. This is because the pattern that is transferred into a physical structure is not a direct combination of design shapes, but is a combination of shapes of spacers derived from a subset of the design shapes that are selected to allow formation of spacers thereararound. Selection and alteration of design shapes around which spacers are to be formed provide astronomical numbers of possibilities. Difficulty in generation of the shapes to be included in the first lithographic mask and the second lithographic mask can arise to an unmanageable level if lateral interconnections are employed along non-lengthwise directions of the design shapes. Thus, a systematic method is desired that can reliably provide a working decomposition method for complex design layouts.

SUMMARY

A design level compatible with a sidewall image transfer process employs an alternating grid of mandrel-type line tracks and non-mandrel-type line tracks. Target structure design shapes are formed such that all vertices of the target structure design shapes are on the grid. Lateral connections are allowed only across the same type of line tracks. The target structure design shapes are classified as mandrel-type design shapes and non-mandrel-type design shapes depending on the track type of the overlapping line tracks for lengthwise portions. All mandrel-type line tracks and straps of the mandrel-type design shapes less lateral strap regions of the non-mandrel-type design shapes collectively form mandrel design shapes, which can be employed to generate a first lithographic mask. Sidewall design shapes are generated from the mandrel design shapes. Blocking shapes for a second lithographic mask can be generated by selecting all areas that are not included in the target structure design shapes or the sidewall design shapes.

According to an aspect of the present disclosure, a method is provided for generating shapes for a plurality of lithographic masks from design shapes for a design level. In a first step, a design layout for a design level including design shapes is provided. Lengthwise portions of the design shapes overlie line tracks extending along a lengthwise direction. In a second step, the line tracks are identified as mandrel-type line tracks and non-mandrel-type line tracks. In a third step, design shapes are identified as mandrel-type design shapes and non-mandrel-type design shapes. All lengthwise edges of mandrel-type design shapes are within mandrel-type line tracks and all lengthwise edges of non-mandrel-type design shapes are within non-mandrel-type line tracks. In a fourth step, mandrel design shapes are generated by performing a union of the mandrel-type line tracks and the mandrel-type design shapes and subtracting areas derived from lateral straps of non-mandrel-type design shapes by expansion by a spacer target width. At least one step among the second, third, and fourth steps is performed employing a computer including one or more processors in communication with a memory device and programmed to perform the at least one step.

According to another aspect of the present disclosure, a system is provided for generating shapes for a plurality of lithographic masks from design shapes for a design level. The system including a computer including one or more processors in communication with a memory device. The computer is programmed to run an automated program including processing steps. The processing steps can include a first step of acquiring a design layout for a design level including design shapes. Lengthwise portions of the design shapes overlie line tracks extending along a lengthwise direction. The processing steps include a second step of identifying the line tracks as mandrel-type line tracks and non-mandrel-type line tracks. The processing steps can include a third step of identifying design shapes as mandrel-type design shapes and non-mandrel-type design shapes. All lengthwise edges of mandrel-type design shapes are within mandrel-type line tracks and all lengthwise edges of non-mandrel-type design shapes are within non-mandrel-type line tracks. The processing steps can include a fourth step of generating mandrel design shapes by performing a union of the mandrel-type line tracks and the mandrel-type design shapes and subtracting areas derived from lateral straps of non-mandrel-type design shapes by expansion by a spacer target width.

BRIEF DESCRIPTION OF SEVERAL VIEWS OF THE DRAWINGS

FIG. 1 is a chart illustrating a typical processing sequence employed to perform a sidewall image transfer (SIT) process.

FIG. 2 is a chart illustrating a set of design rules for implementing a sidewall image transfer method in conjunction with the mask decomposition method according to an embodiment of the present disclosure.

DETAILED DESCRIPTION

Figure 3:
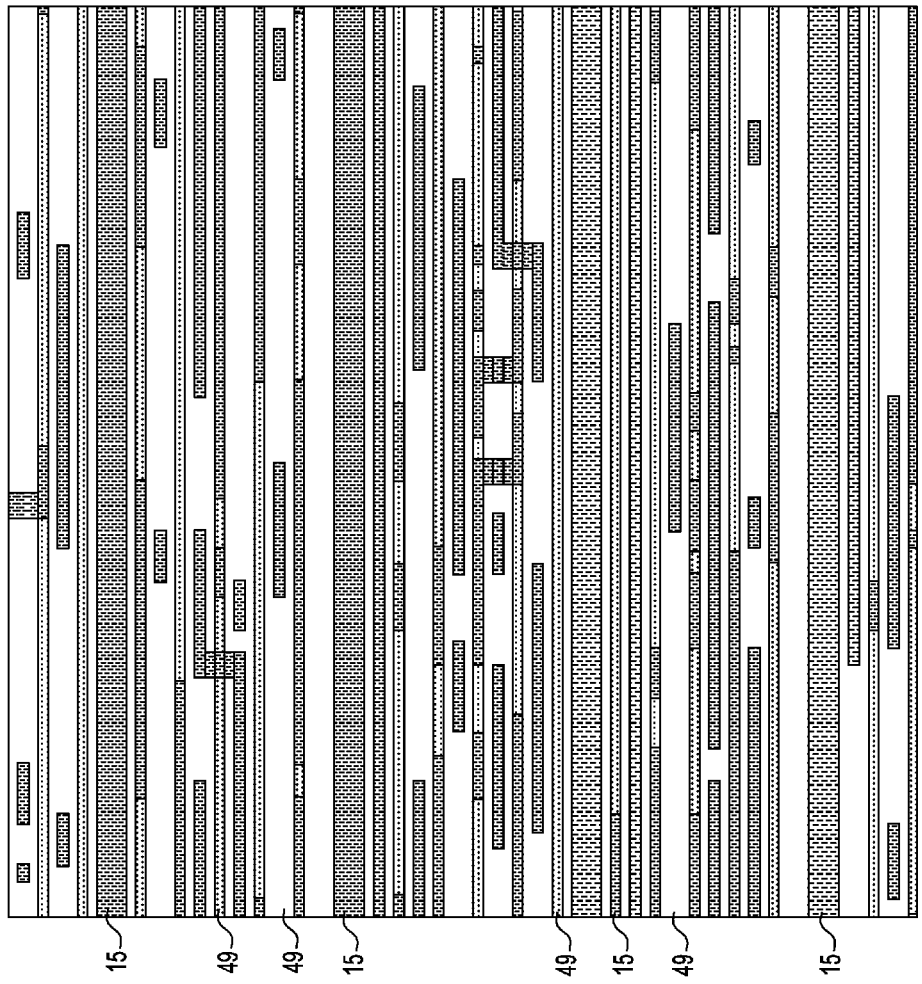
FIG. 3 is an exemplary design layout is shown as provided for generation of design shapes for a first lithographic mask and for generation of design shapes for a second lithographic mask according to an embodiment of the present disclosure.

As stated above, the present disclosure relates to a method of designing shapes for a design level employing sidewall image transfer within a design layout, and a method of generating a set of lithographic masks from the design layout for a sidewall image transfer process, and an apparatus for implementing the method, and an apparatus for implementing the same. Aspects of the present disclosure are now described in detail with accompanying figures. It is noted that like and corresponding elements are referred to by like reference numerals. The drawings are not drawn to scale. As used herein, ordinals such as "first" and "second" are employed merely to distinguish similar elements, and different ordinals may be employed to designate a same element in the specification and/or claims.

Figure 2:
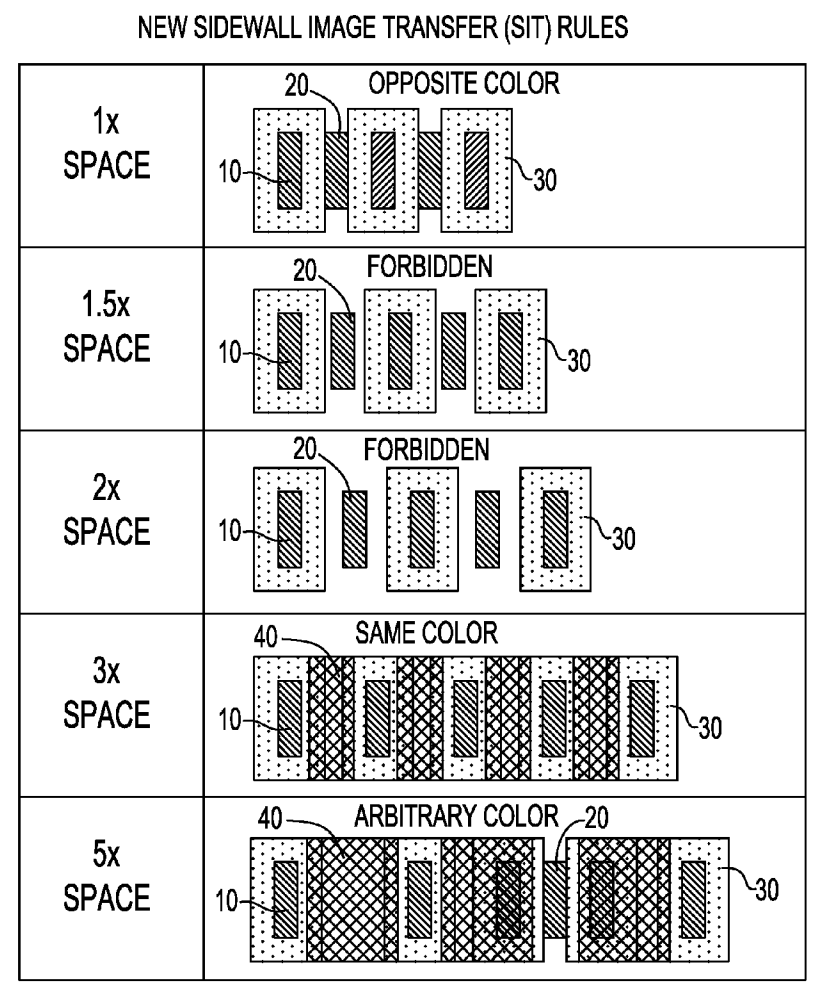

Referring to FIG. 2, a set of design rules for implementing a sidewall image transfer (SIT) process is schematically illustrated, which can be employed in conjunction with the mask decomposition method according to an embodiment of the present disclosure to provide a set of lithographic masks. The design level selected for implementation of the SIT process can be a metal line level or a gate conductor level or any level that includes a predominant direction for edges.

As used herein, an "edge" refers to lines connecting vertices of a polygon defining a design shape in a design level. A metric for measuring a property of each edge is a "length" of the edge, which is the distance between the two vertices that define the edge. In some designs, more than 50% of the total length, i.e., the sum of all lengths of edges of the design shapes, in a design level can be due to a set of edges extending along a same direction. In such cases, the direction along which edges corresponding to more than 50% of the total length of all edges extend is herein referred to as a "predominant" direction, or a "lengthwise" direction, of the design layout for the design level. An edge that extends along the lengthwise direction is herein referred to as a "lengthwise edge." The direction perpendicular to the lengthwise direction within the plane of the design layout is herein referred to as a "widthwise" direction. An edge that extends along the widthwise direction is herein referred to as a "widthwise edge."

The set of design rule includes a rule that allows use of "1x space" provided that each neighboring design shapes separated by 1x space is classified as different types of design shapes.

As used herein, an "ix space" refers to a distance that is the product of the number i and the spacer target width under the design rules for the corresponding design level. The spacer target width is the target lateral dimension between a most proximate pair of sidewalls of a spacer as provided by the design rule, and corresponds to the thickness of the spacer illustrated in FIG. 1.

The different types of design shapes can be labeled in various methods. In one embodiment, the different types of design shapes can include a "mandrel-type" and a "non-mandrel-type." The mandrel-type design shapes refer to design shapes to be incorporated into a first lithographic mask employed to print the pattern of mandrels as illustrated in FIG. 1, and to be subsequently reproduced in a physical structure after the pattern transfer etch illustrated in FIG. 1. The non-mandrel-type design shapes refer to design shapes not to be incorporated into the first lithographic mask, but to be reproduced in the physical structure after the pattern transfer etch illustrated in FIG. 1 through incorporation of additional design shapes defining the second lithographic mask. The additional design shapes are derived from the non-mandrel-type design shapes and the mandrel-type design shapes by shape generation operations to be describe herebelow. Under this scheme, for each neighboring design shapes separated by 1x space, one of the neighboring design shapes is classified as a mandrel-type design shape 10, and the other of the neighboring design shapes is classified as a non-mandrel-type design shape 20. Spacer design shapes 30, which correspond to areas of spacers to be formed on mandrels on a physical structure, are also illustrated in FIG. 2.

In another embodiment, the mandrel-type and the non-mandrel-type can be referred to as a first-color-type and a second-color-type, respectively. The operation of classifying the design shapes into the first-color-type design shapes and the second-color-type design shapes is herein referred to as a "coloring" operation. Under this scheme, for each neighboring design shapes separated by 1x space, one of the neighboring design shapes is classified as a first-color design shape, and the other of the neighboring design shapes is classified as a second-color design shape.

The set of design rules includes a rule that prohibits use of "kx space" for all value of k greater than 1.0 and not more than 2.0. This effect of this rule is to prevent generation of patterns including a width in a range between a minimum line width and the sum of the minimum line width and twice the spacer target width.

The set of design rules includes a rule that allows the use of "mx space" for all values of m greater than 2.0 and less than 3.0 provided that both of design shapes separated by an mx space is classified as a "mandrel-type design shapes" (or first-color-type design shapes). A blocking design shape 40 can be employed to represent physical areas to be blocked by the second lithographic mask, which include physical areas corresponding to the space between neighboring pairs of design shapes separated by an mx space in which m greater than 2.0 and less than 3.0.

The set of design rules includes a rule that allows use of "nx space" for all values of n not less than 3.0 without any constraint on the classification of each design shape within a neighboring pair of design shapes separated by the nx space. Blocking design shapes 40 can be appropriately used irrespective of the classification of the design shapes in this case.

The set of design rules can be implemented as an automated program that runs on a computer. As used herein, a "computer" refers to all types of conventional computers such as a personal computer, a laptop computer, a server and/or a client, and a mainframe computer, as well as portable devices capable of running an automated program and cloud computing environments. The computer includes one or more processors in communication with a memory device, and can be programmed to implement the set of design rules while running a design program that allows generation of a design layout based on input data and human inputs.

The design layout includes design shapes belonging to a design level of which the pattern is replicated as physical shapes on a substrate during manufacturing through the SIT process. Generation of design data for a first lithographic mask and a second lithographic mask from the design layout is performed prior to manufacturing so that a physical first lithographic mask and a physical second lithographic mask can be manufactured for use in a first lithography step and in a second lithography step, respectively, during the manufacturing of the physical patterned structures.

Referring to FIG. 3, design layout for a design level including design shapes is provided. Once a design layout for a design level is provided, line tracks 49 are identified. As used herein, a "line track" refers to a rectangular strip that extends along the lengthwise direction in the design layout, i.e., a direction along which a predominant portion of the edges of the design shapes within the design level extend. Each line track 49 has a width that is one of the allowed widths according to the set of design rules, and is laterally spaced from at least one neighboring line track. The spacing between each neighboring pair of line tracks 49 is selected from a list of allowable spacings provided under the set of design rules.

Each line track 49 can extend from one end of a region including the design shapes 15 to the opposite end of the region. If the region including the design shapes 15 is rectangular, each line track 49 can extend from one side of the rectangle defining the region to an opposite side of the rectangle. The line tracks 49 extend along the lengthwise direction of the design layout. In one embodiment, lengthwise portions of the design shapes 15 can overlie line tracks 49 extending along the lengthwise direction. As used herein, a "lengthwise portion" refers to a portion of a design shape 15 that overlies only a single line track 49. In one embodiment, a design shape 15 may include a portion that does not overlie a line track 49 and/or overlie a plurality of line tracks 49. A portion of a design shape 15 that does not overlie a single line track 49, i.e., located outside of a single line track 49 is herein referred to as a "lateral strap." In one embodiment, each of the design shapes 15 can be located on a single line track (9 or 19) or can include at least one lateral strap that straddles only one line track 49 or an odd number of line tracks 49. As used herein, a lateral strap "straddles" a line track 49 if the lateral strap extends outside both lengthwise edges of the line track 49. In one embodiment, all lateral straps that straddle any line track 49 includes a pair of edges that are perpendicular to the lengthwise direction, i.e., a pair of edges that are parallel to the widthwise direction. Rules on the geometry of the design shapes 15 can be can be implemented within an automated program employed to design the design shapes for the design level. As used herein, the area of a lateral strap excludes areas overlapping with outermost line tracks of the line shape 15 including the lateral strap, although embodiments in which at least a portion of the outermost line tracks is included within a lateral strap can provide the same result for the purpose of generation of lithographic masks.

In one embodiment, a spacing between a neighboring pair of line tracks 49 is the same as the spacer target width. In this case, the neighboring pair of line tracks 49 is in a 1x space configuration, i.e., at a minimum distance between a neighboring pair of line tracks allowed under the set of design rules discussed above.

In one embodiment, each spacing between a neighboring pair of line tracks 49 is the same as the spacer target width or is greater than two times the spacer target width as required under the set of design rules discussed above. The spacer target width is a predetermined parameter provided as a design constraint for the design level, and can be a process assumption.

In one embodiment, all vertices of the design shapes 15 can be located on lengthwise edges of the line tracks 49 that the design shapes 15 overlie.

Figure 4:
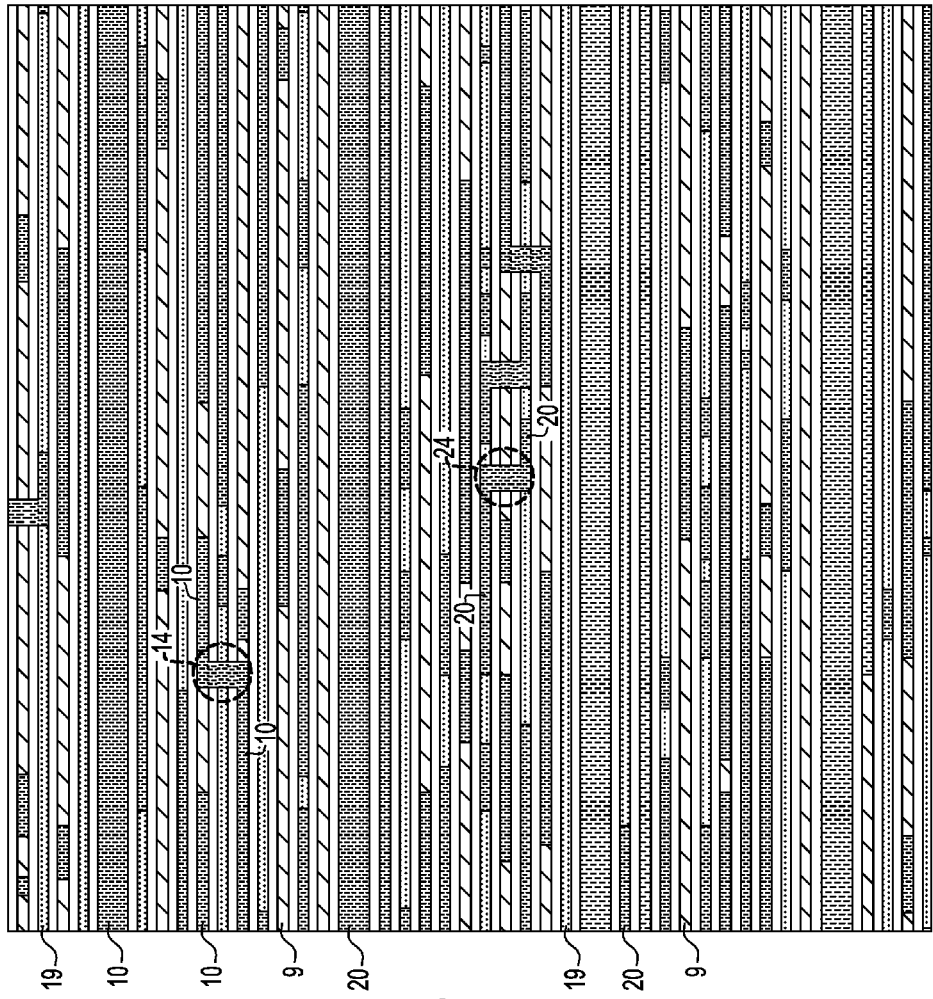
FIG. 4 is the exemplary design layout after identifying design shapes as mandrel-type design shapes and non-mandrel-type design shapes according to an embodiment of the present disclosure.

Referring to FIG. 4, the line tracks 49 are identified, i.e., classified, as mandrel-type line tracks 9 and non-mandrel-type line tracks 19. Classification of the line tracks 49 into the mandrel-type line tracks 9 and the non-mandrel-type line tracks 19 can be performed by an automated program, which can, for example, randomly select one of the line tracks 49 as a mandrel-type line track 9, and alternately assign adjacent tracks such that each mandrel-type line track 9 can have only non-mandrel-type line tracks 19 as neighboring line tracks, and each non-mandrel-type line track 19 can have only mandrel-type line tracks 9 as neighboring line tracks. Alternately, one of the line tracks 49 can be randomly classified as a non-mandrel-type line track 19, and alternately assign adjacent tracks such that each mandrel-type line track 9 can have only non-mandrel-type line tracks 19 as neighboring line tracks, and each non-mandrel-type line track 19 can have only mandrel-type line tracks 9 as neighboring line tracks. Optionally, any algorithm for preferentially selecting a predefined type of line track 15 as a first line track to be identified as a mandrel-type line track 9 or as a non-mandrel-type line track 19 may be employed. Upon classification of all line tracks 15 as mandrel-type line tracks 9 or non-mandrel-type line tracks 19, the classified line tracks (9, 19) constitute an alternating array of mandrel-type line tracks 9 and non-mandrel-type line tracks 19.

Subsequently, the design shapes 15 are identified, i.e., classified, as mandrel-type design shapes 10 or non-mandrel-type design shapes 20. A design shape 15 can be classified as a mandrel-type design shape 10 if all lengthwise edges of the design shape 15 are within the area of at least one mandrel-type line track 9, i.e., overlie mandrel-type line tracks 19. A design shape 15 can be classified as a non-mandrel-type design shape 20 if all lengthwise edges of the design shape 15 are within the area of at least one non-mandrel-type line track 19. If at least one lengthwise edge of a design shape 15 is within the area of a mandrel-type line track 9 and at least another lengthwise edge of the design shape 15 is within the area of a non-mandrel-type line track 19, such a design shape 15 can be flagged as a non-compliant design shape that violates a design rule, and the design layout can be rejected or returned to an originator or to a designer for correction. After classification of all design shapes 15 into mandrel-type design shapes 10 and non-mandrel-type design shapes 20 for a design layout that does not include an error, all lengthwise edges of mandrel-type design shapes 10 are within mandrel-type line tracks 9, and all lengthwise edges of non-mandrel-type design shapes 20 are within non-mandrel-type line tracks 19.

A mandrel-type design shape 10 can include a mandrel-type lateral strap 14, which straddles at least one non-mandrel-type line track 19. A mandrel-type lateral strap 14 can straddle a total of N mandrel-type line track(s) 9 and (N+1) mandrel-type line track(s) 19, in which N is a non-negative integer.

A non-mandrel-type design shape 20 can include a non-mandrel-type lateral strap 24, which straddles at least one mandrel-type line track 9. A non-mandrel-type lateral strap 24 can straddle a total of M mandrel-type line track(s) 19 and (M+1) mandrel-type line track(s) 9, in which M is a non-negative integer.

Figure 5:
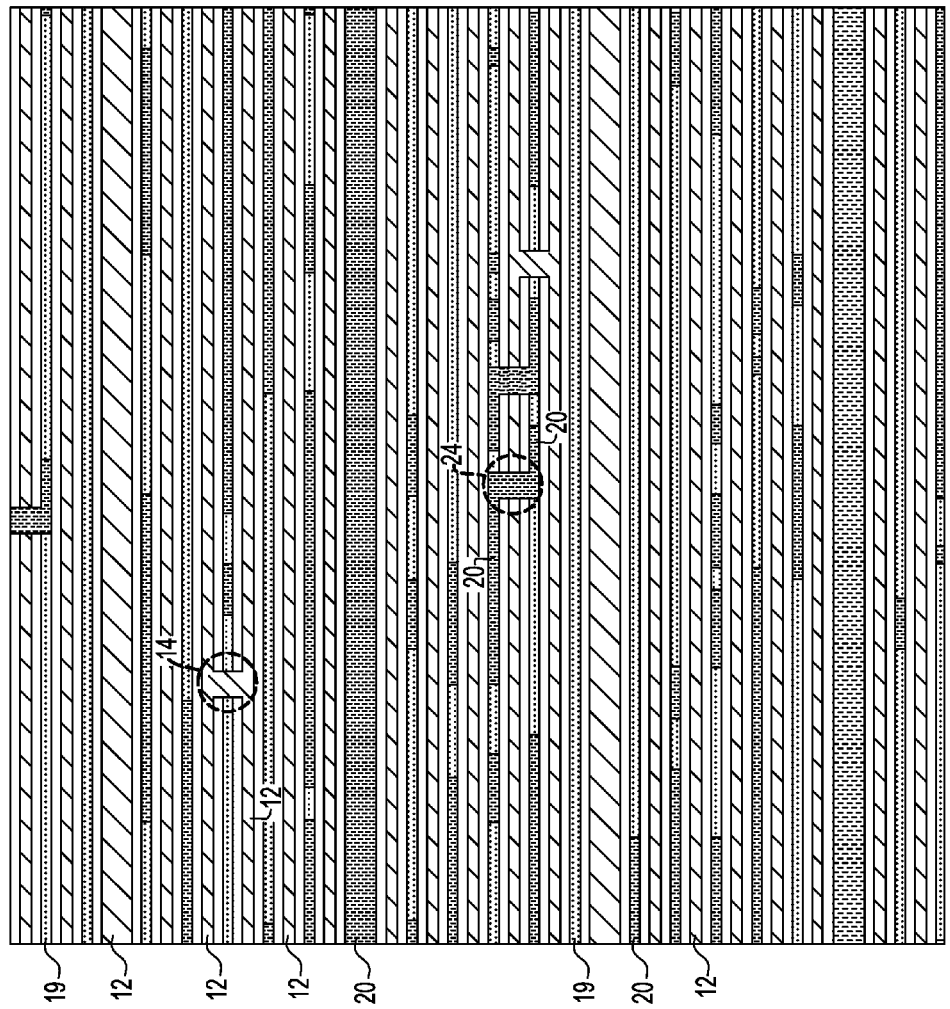
FIG. 5 is the exemplary design layout after generating mandrel design shapes according to an embodiment of the present disclosure.

Referring to FIG. 5, mandrel design shapes 12 are generated from the mandrel-type line tracks 9, mandrel-type design shapes 10, and non-mandrel-type design shapes 20. In one embodiment, the mandrel design shapes 12 can be generated by performing a union of the mandrel-type line tracks 9 and the mandrel-type design shapes 10 and then subtracting areas derived from non-mandrel-type lateral straps 24, i.e., lateral straps of non-mandrel-type design shapes 20, by expansion by the spacer target width. In other words, the lateral non-mandrel-type lateral straps 24 are expanded along the lengthwise direction by the distance of the spacer target width provided by the design rules to generate a set of areas DLS derived from non-mandrel-type lateral straps 24. If the set of the areas of the mandrel-type line tracks 9 is represented by a set MT, and if the set of the areas of the mandrel-type design shapes 10 is represented by a set MS, and if the set of the areas of the mandrel design shapes 12 is represented by a set MDS, the set MDS is given by: MDS=(MT$\cup$MS)−DLS.

Figure 6:
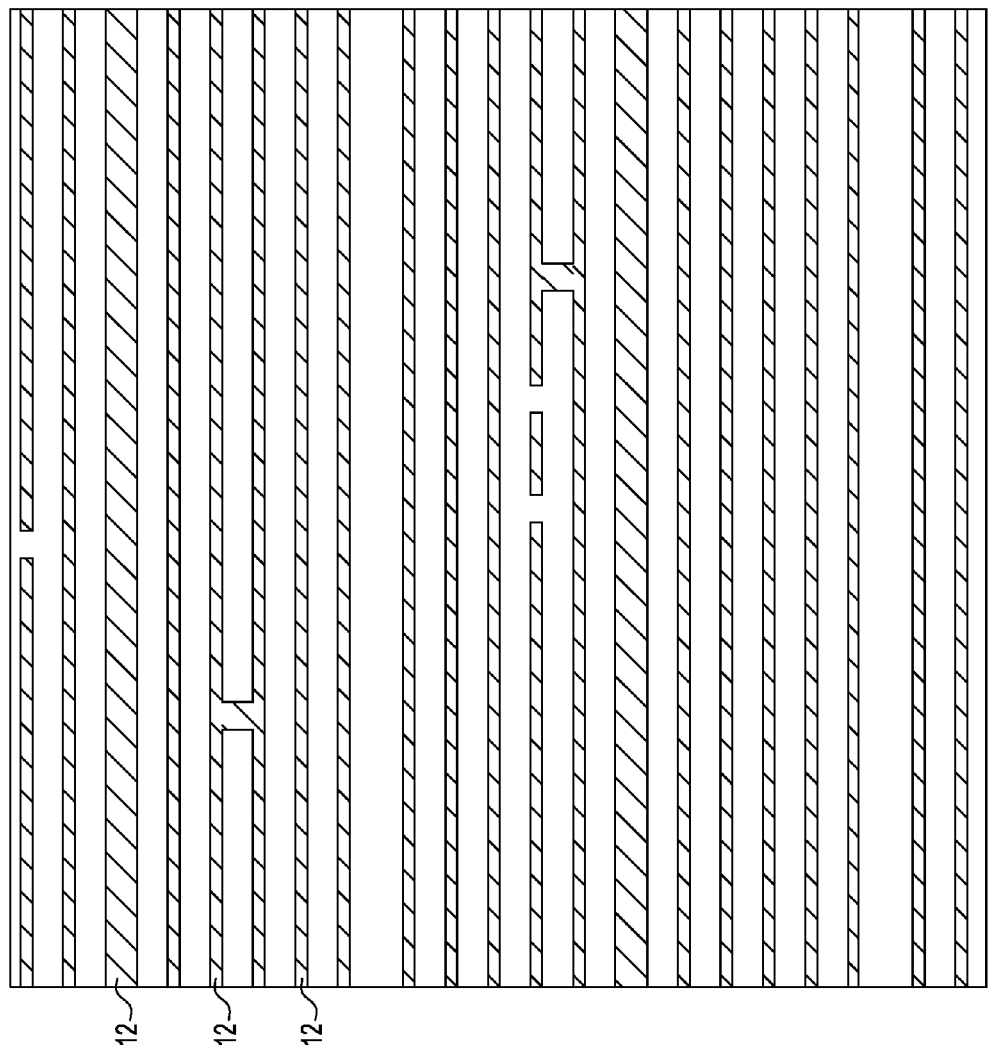
FIG. 6 is the exemplary design layout illustrating only mandrel design shapes according to an embodiment of the present disclosure.

Referring to FIG. 6, a set of mandrel design shapes 12 generated employing the methods described above is illustrated. A first lithographic mask can be manufactured employing the pattern including only the set of mandrel design shapes 12. The first lithographic mask generated by this method can be employed as the first lithographic mask for an SIT process illustrated in FIG. 1.

Figure 7:
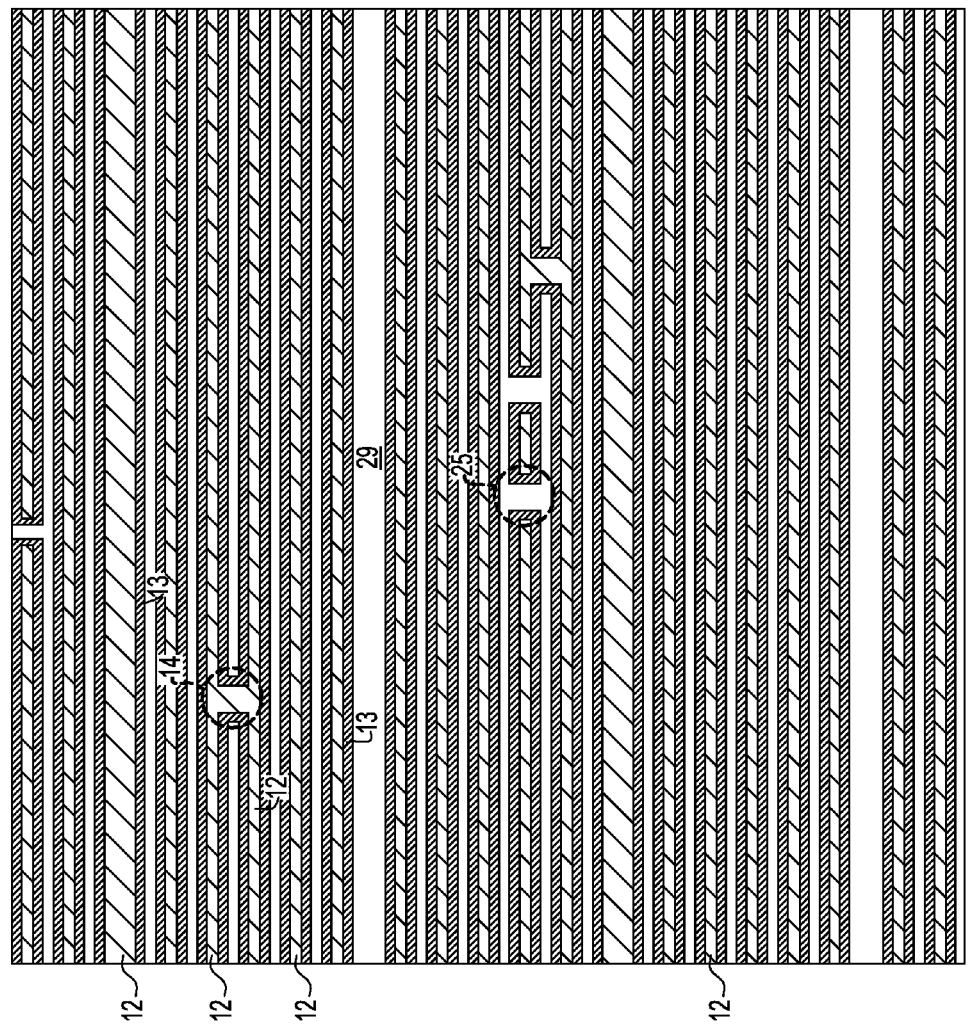
FIG. 7 is the exemplary design layout after generating sidewall design shapes according to an embodiment of the present disclosure.

Referring to FIG. 7, sidewall design shapes 13 are generated from the mandrel design shapes 12. The sidewall design shapes 13 can be generated, for example, by offsetting all edges of the mandrel design shapes 13 outward by the spacer target width within the entire region in which the design layout is defined. The areas within the offset edges of the mandrel design shapes 13 less the area of the mandrel design shapes are areas of the sidewall design shapes 13.

Figure 8:
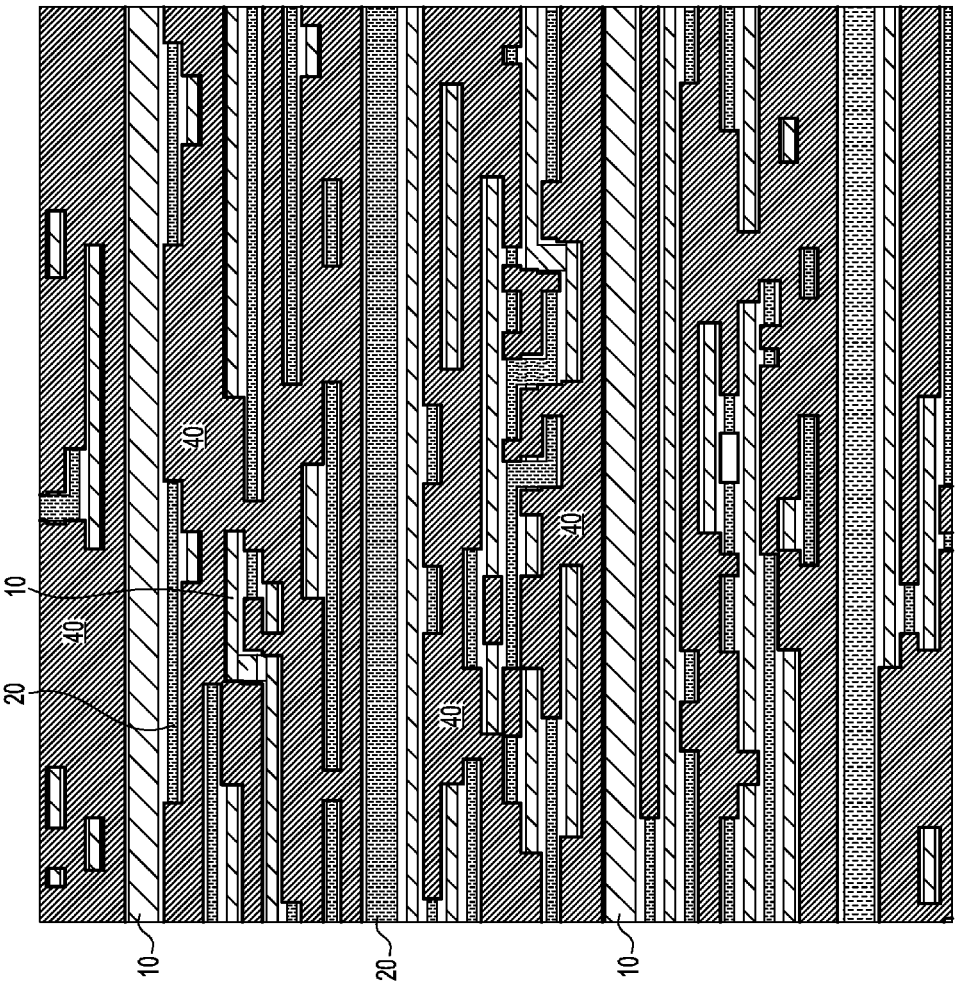
FIG. 8 is the exemplary design layout after generating block mask shapes according to an embodiment of the present disclosure.

Referring to FIG. 8, block mask shapes 40 are generated from the design shapes (10, 20) and the sidewall design shapes 13. In one embodiment, the block mask shapes 40 can be generated by generating a union of the design shapes (10, 20) and the sidewall design shapes 13, and subsequently generating a complement of the union. The complement constitutes the block mask shapes 40. The area of the block mask shapes 40 is the same as the sum of all areas that do not overlap with the design shapes (10, 20) or the sidewall design shapes 13. Thus, the block mask shapes 40 can also be derived from the design shapes (10, 20) and the sidewall design shapes 13 by adding all areas that do not overlap with the design shapes (10, 20) or the sidewall design shapes 13.

Whether the block mask shapes 40 generated by this method correctly identifies the areas for a correct second lithographic mask can be checked by performing a verification operation. For example, the verification operation can include generating the sum of all areas of the sidewall design shapes 13 and the block mask shapes 40. If the areas of the complement of the sum of all areas of the sidewall design shapes 13 and the block mask shapes 40 is the same as the areas of the design shapes (10, 20) as provided in the design layout, the generated block mask shapes 40 are correct. In another verification operation, the sum of all areas of the design shapes (10, 20) and the block mask shapes 40 can be generated. If the areas of the complement of the sum of all areas of the design shapes (10, 20) and the block mask shapes 40 are the same as the areas of the sidewall design shapes 13, the generated block mask shapes 40 are correct.

A second lithographic mask can be manufactured employing the pattern including only the set of block mask shapes 40. The second lithographic mask generated by this method can be employed as the second lithographic mask for an SIT process illustrated in FIG. 1.

Each of the steps corresponding to FIGS. 3-8 can be performed employing a particular computer including one or more processors in communication with a memory device and programmed to perform any of the steps described above through an automated program.

Figure 9:
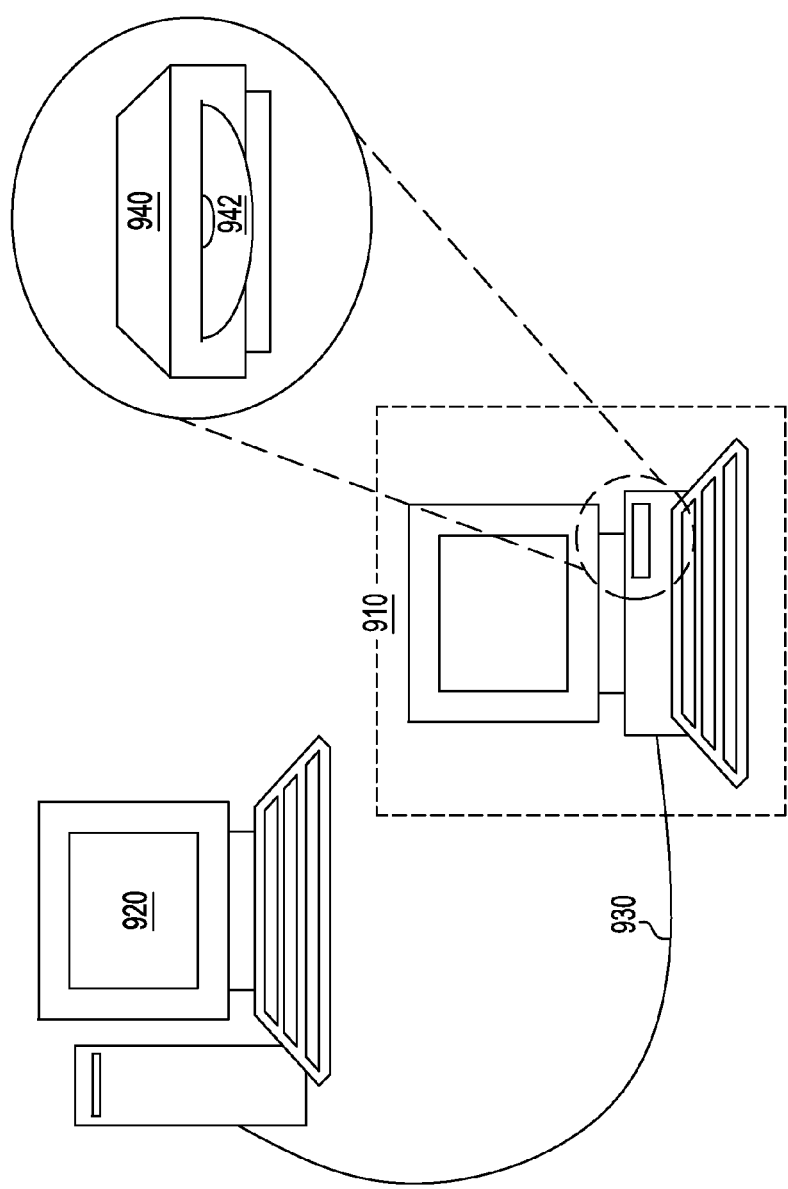
FIG. 9 illustrates an exemplary apparatus that can be employed to implement the methods of various embodiments of the present disclosure.

Referring to FIG. 9, an exemplary apparatus is illustrated, which can be employed to implement the methods of various embodiments of the present disclosure. The apparatus can be configured to perform at least one and/or any of the steps illustrated in FIGS. 3-8 in an automated step by running an automated program on any computing means known in the art. The apparatus can be employed to decompose design shapes in a design level into a plurality of target design levels representing a physical lithographic mask. The apparatus includes one or more processors in communication with a memory and is configured to run the automated program.

The automated program can include any or all of the steps of FIGS. 3-8. In one embodiment, the apparatus can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. The database can store all or a subset of the design shapes for the design level as provided at the processing step corresponding to FIG. 3 or generated at later processing steps. If the database 920 is a standalone computing means, a data cable 930 or wireless communication can be employed to transfer data between the database 920 and the at least one computing means 910. The database can store information on process assumptions, and any or all of predefined parameters to be employed while the automated program runs.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps corresponding to FIGS. 3-8.

The design data can include the various design shapes for the design level as originally provided, and for each and/or all of the various mask level design layouts of the present disclosure. The design data for the mask level design layouts of the present disclosure can be transferred to a manufacturing facility that can manufacture a set of lithographic masks corresponding to the design shapes for the mask level design layouts. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

A machine-readable medium embodying the design data for the mask level design layouts of the present disclosure can have the functionality of generating a representation, in a format perceptible by humans or recognizable by an automated machine (such as an optical character reader or a program configured to recognize graphics data), of a semiconductor structure, a semiconductor device, a semiconductor circuit, or any other physical implementation of the devices and structures of the present disclosure. The design data for the mask level design layouts of the present disclosure, as embodied in the machine-readable medium, can be organized such that the inherent physical or logical relationship among data elements can be represented in a temporary or permanent display device such as a computer monitor or at least one printed sheet of paper. Further, the design data for the mask level design layouts of the present disclosure can be designed to support specific data manipulation functions, including, but not limited to, editing, adding, subtracting, or otherwise modifying or modulating the various data elements within the design data for the mask level design layouts. In addition, the design data for the mask level design layouts of the present disclosure can be configured to cause the representation in the format perceptible by humans or recognizable by an automated machine to include various display elements (e.g., line, curves, symbols, areas, volumes, etc.) that correspond to each of the various data elements within the design data for the mask level design layouts. The design data for the mask level design layouts of the present disclosure can be a functional descriptive material as recorded on the machine-readable medium, and as such, can become structurally and functionally interrelated to the machine-readable medium so as to change the format and organization of the various memory elements within the machine-readable medium and confer a functionality of generating at least one visual representation when read by a display program, which can be a visual display program or a printing program, and can reside in a computing device, or can be encoded within the same machine-readable medium, or can be encoded within a different machine-readable medium that can be read by the same computing device that reads the machine-readable medium encoding the design data for the mask level design layouts of the present disclosure.

In one embodiment, a machine-readable medium embodying the design data for the mask level design layouts of the present disclosure can additionally encode a computer program that enables the generation of a representation, in a format perceptible by humans or recognizable by an automated machine. In one embodiment, the computer program that enables the generation of a representation, in a format perceptible by humans or recognizable by an automated machine can reside in a computing device or in another machine-readable medium that can be read by a computing device configured to read the machine-readable medium embodying the design data for the mask level design layouts of the present disclosure.

Upon running of the computer program on the design data for the mask level design layouts of the present disclosure, a representation of the design data for the t mask level design layouts can be generated in a format perceptible by humans or recognizable by an automated machine, which can be employed to design, manufacture, and/or to test any of a semiconductor structure, a semiconductor device, a semiconductor circuit, or any other physical implementation of the devices, structures and/or circuits of the present disclosure as embodied in the design data for the mask level design layouts. Alternately or additionally, a representation of the design data for the mask level design layouts as generated in a format perceptible by humans or recognizable by an automated machine can be employed to design, manufacture, and/or to test any design for a semiconductor structure, a semiconductor device, a semiconductor circuit, or any other physical implementation of the devices and structures of the present disclosure as embodied in the design data for the mask level design layouts.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method for generating shapes for a plurality of lithographic masks from design shapes for a design level and manufacturing at least one of the plurality of lithographic masks, said method comprising processing steps of:
   a first step of providing a design layout for a design level including design shapes, wherein lengthwise portions of said design shapes overlie line tracks extending along a lengthwise direction;
   a second step of identifying said line tracks as mandrel-type line tracks and non-mandrel-type line tracks;
   a third step of identifying design shapes as mandrel-type design shapes and non-mandrel-type design shapes, wherein all lengthwise edges of mandrel-type design shapes are within mandrel-type line tracks and all lengthwise edges of non-mandrel-type design shapes are within non-mandrel-type line tracks;
   a fourth step of generating mandrel design shapes by performing a union of said mandrel-type line tracks and said mandrel-type design shapes and then subtracting areas derived from lateral straps of non-mandrel-type design shapes by expansion by a spacer target width; and
   a fifth step of manufacturing the at least one of the plurality of lithographic masks by processing at least one physical structure based on the mandrel design shapes generated in the fourth step.

2. The method of claim 1, further comprising generating sidewall design shapes by offsetting edges of said mandrel design shapes by said spacer target width.

3. The method of claim 2, further comprising generating block mask shapes defined by adding all areas that do not overlap with said design shapes or said sidewall design shapes.

4. The method of claim 2, further comprising generating block mask shapes by:
generating a union of said design shapes and said sidewall design shapes; and
generating a complement of said union, wherein said complement constitutes said block mask shapes.

5. The method of claim 1, wherein said identified line tracks constitute an alternating array of mandrel-type line tracks and non-mandrel-type line tracks.

6. The method of claim 1, wherein each of said design shapes is located on a single line track or includes a lateral strap that straddles only one line track or an odd number of line tracks.

7. The method of claim 6, wherein all lateral straps that straddle any line track includes a pair of edges that are perpendicular to said lengthwise direction.

8. The method of claim 1, wherein a spacing between a neighboring pair of line tracks is the same as said spacer target width.

9. The method of claim 1, wherein each spacing between a neighboring pair of line tracks is the same as said spacer target width or is at least two times said spacer target width.

10. The method of claim 1, wherein all vertices of said design shapes are on lengthwise edges of said line tracks that said design shapes overlie.

11. A system for generating shapes for a plurality of lithographic masks from design shapes for a design level and manufacturing at least one of the plurality of lithographic masks, said system comprising:
a computer including one or more processors in communication with a memory device, said computer programmed to run an automated program, said automatic program comprising instructions which, when executed by said computer, performs processing steps including:
a first step of acquiring a design layout for a design level including design shapes, wherein lengthwise portions of said design shapes overlie line tracks extending along a lengthwise direction;
a second step of identifying said line tracks as mandrel-type line tracks and non-mandrel-type line tracks;
a third step of identifying design shapes as mandrel-type design shapes and non-mandrel-type design shapes, wherein all lengthwise edges of mandrel-type design shapes are within mandrel-type line tracks and all lengthwise edges of non-mandrel-type design shapes are within non-mandrel-type line tracks; and
a fourth step of generating mandrel design shapes by performing a union of said mandrel-type line tracks and said mandrel-type design shapes and subtracting areas derived from lateral straps of non-mandrel-type design shapes by expansion by a spacer target width; and
a manufacturing apparatus configured to manufacture the at least one of the plurality of lithographic masks by processing at least one physical structure based on the mandrel design shapes generated fourth step by the computer.

12. The system of claim 11, wherein said processing steps performed by said instructions further includes a processing step of generating sidewall design shapes by offsetting edges of said mandrel design shapes by said spacer target width.

13. The system of claim 12, wherein said processing steps performed by said instructions further includes a processing step of generating block mask shapes defined by adding all areas that do not overlap with said design shapes or said sidewall design shapes.

14. The system of claim 12, wherein said processing steps performed by said instructions further includes a processing step of generating block mask shapes by:
generating a union of said design shapes and said sidewall design shapes; and
generating a complement of said union, wherein said complement constitutes said block mask shapes.

15. The system of claim 11, wherein said identified line tracks constitute an alternating array of mandrel-type line tracks and non-mandrel-type line tracks.

16. The system of claim 11, wherein each of said design shapes is located on a single line track or includes a lateral strap that straddles only one line track or an odd number of line tracks.

17. The system of claim 16, wherein all lateral straps that straddle any line track includes a pair of edges that are perpendicular to said lengthwise direction.

18. The system of claim 11, wherein a spacing between a neighboring pair of line tracks is the same as said spacer target width.

19. The system of claim 11, wherein each spacing between a neighboring pair of line tracks is the same as said spacer target width or is at least two times said spacer target width.

20. The system of claim 11, wherein all vertices of said design shapes are on lengthwise edges of said line tracks that said design shapes overlie.

* * * * *